United States Patent
Liu et al.

(10) Patent No.: US 8,749,135 B2
(45) Date of Patent: Jun. 10, 2014

(54) MOTHER SUBSTRATE STRUCTURE OF LIGHT EMITTING DEVICES, LIGHT EMITTING DEVICE AND METHOD OF FABRICATING THE SAME

(75) Inventors: Chih-Che Liu, Nantou County (TW); Shih-Feng Hsu, Taoyuan County (TW)

(73) Assignee: Au Optronics Corporation, Hsinchu (TW)

( * ) Notice: Subject to any disclaimer, the term of this patent is extended or adjusted under 35 U.S.C. 154(b) by 121 days.

(21) Appl. No.: 13/197,780

(22) Filed: Aug. 4, 2011

(65) Prior Publication Data

US 2012/0294003 A1    Nov. 22, 2012

(30) Foreign Application Priority Data

May 17, 2011    (TW) ............................. 100117230 A (51) Int. Cl.
  *H05B 33/04*    (2006.01)
  *H01L 51/52*    (2006.01)

(52) U.S. Cl.
  CPC .................................. *H01L 51/525* (2013.01)
  USPC ........................................... 313/512; 445/25

(58) Field of Classification Search
  USPC ...................................... 313/512; 445/23–25
  See application file for complete search history.

(56) References Cited

U.S. PATENT DOCUMENTS

| | | | |
|---|---|---|---|
| 6,951,494 B2 | 10/2005 | Noma et al. | |
| 2007/0177069 A1* | 8/2007 | Lee | 349/56 |
| 2007/0232182 A1* | 10/2007 | Park | 445/25 |
| 2008/0160864 A1 | 7/2008 | Song et al. | |
| 2009/0134782 A1* | 5/2009 | Kim | 313/504 |
| 2009/0273589 A1* | 11/2009 | Asano et al. | 345/204 |
| 2010/0008026 A1 | 1/2010 | Kwon et al. | |
| 2012/0026074 A1* | 2/2012 | Lee et al. | 345/76 |

OTHER PUBLICATIONS

"Office Action of Taiwan Counterpart Application", issued on Apr. 2, 2014, p. 1-p. 8.

* cited by examiner

*Primary Examiner* — Andrew Coughlin
(74) *Attorney, Agent, or Firm* — Jianq Chyun IP Office (57) ABSTRACT

A mother substrate structure includes a mother substrate, a cover plate, a sealant and a spacer structure. The mother substrate has light emitting units thereon. The cover plate is disposed above the mother substrate and has unit regions, each unit region corresponding to one of the light emitting unit. The cover plate has a cutting line around each unit region, sealant regions between the cutting line and each of the unit regions, and spacer disposing regions between the cutting line and each of the sealant regions, wherein a distance between the cutting line and each of the spacer disposing region is 0~100 um. The sealant is disposed in the sealant regions to bond the mother substrate and the cover plate. The spacer structure is disposed in the spacer disposing regions and surrounds each of the light emitting units, and materials of the spacer structure and the sealant include a glass fit.

11 Claims, 6 Drawing Sheets

FIG. 3 ium. The sealant is disposed
MOTHER SUBSTRATE STRUCTURE OF LIGHT EMITTING DEVICES, LIGHT EMITTING DEVICE AND METHOD OF FABRICATING THE SAME

CROSS-REFERENCE TO RELATED APPLICATION

This application claims the priority benefit of Taiwan application serial no. 100117230, filed May 17, 2011. The entirety of the above-mentioned patent application is hereby incorporated by reference herein and made a part of this specification.

BACKGROUND OF THE INVENTION

1. Field of the Invention

The present invention relates to a mother substrate structure of light emitting devices, a light emitting device and a method of fabricating the same.

2. Description of Related Art

The information and communication industries have become indispensable in our society thanks to the focused development of various portable communication and display products. As the flat panel display is one of the communication interfaces between human and an information device, development of the flat panel display is rather essential. The organic light emitting device has tremendous application potential to become the mainstream of the next generation flat panel display due to its advantages of self-luminescence, wide viewing angle, low power consumption, simple manufacturing process, low cost, low working temperature, high response speed, full-color display, and so forth.

Generally, if an organic light emitting material of the organic light emitting device is exposed in an environment having oxygen and moisture, the organic light emitting material is easily deteriorated. Conventionally, after a plurality of organic light emitting units are formed on a mother substrate, the organic light emitting units are sealed with a cover plate and a sealant, and a desiccation agent or a filler is further disposed between the mother substrate and the cover plate, so as to prevent oxygen and moisture from intruding into the organic light emitting units. Then, a cutting process is performed so as to form a plurality of organic light emitting devices. It is noted, if the cutting force of the cutting process is not controlled well, the sealant may be damaged, and oxygen and moisture may intrude into the organic light emitting units to affect the organic light emitting material. Therefore, how to avoid the cutting process damaging the sealant of the organic light emitting devices is important.

SUMMARY OF THE INVENTION

Accordingly, the present invention is directed to a mother substrate structure of light emitting devices, a light emitting device and a method of fabricating the same capable of improving the cutting process quality and preventing the cutting process from damaging the sealant of the organic light emitting devices.

The present invention provides a mother substrate structure of light emitting devices comprising a mother substrate, a cover plate, a sealant and a spacer structure. The mother substrate includes a plurality of light emitting units thereon. The cover plate is disposed above the mother substrate and comprises a plurality unit of regions, and each of the unit regions is corresponding to one of the light emitting units on the mother substrate. The cover plate further comprises a cutting line around each of the unit regions, a plurality unit of sealant regions between the cutting line and each of the unit regions, and a plurality unit of spacer disposing regions between the cutting line and each of the sealant regions, wherein a distance between the cutting line and each of the spacer disposing regions is 0~100 μm. The sealant is disposed in the sealant regions so as to bond the mother substrate and the cover plate together. The spacer structure is disposed in the spacer disposing regions and surrounds each of the light emitting units, wherein a material of the spacer structure and a material of the sealant include a glass frit.

The present invention provides a light emitting device comprising a substrate, a cover plate, a sealant and a spacer structure. The substrate comprises a light emitting unit thereon. The cover plate is disposed above the substrate and comprises a unit region corresponding to the light emitting unit on the substrate. The cover plate further comprises a cutting line around the unit region, a sealant region between the cutting line and the unit region, and a spacer disposing region between the cutting line and the sealant region, wherein a distance between the cutting line and the spacer disposing region is 0~100 μm. The sealant is disposed in the sealant region so as to bond the substrate and the cover plate together. The spacer structure is disposed in the spacer disposing region and surrounds the light emitting unit, wherein a material of the spacer structure and a material of the sealant include a glass frit.

The present invention also provides a method of fabricating a light emitting device comprising the following steps. A mother substrate including a plurality of light emitting units thereon is provided. A cover plate comprising a plurality unit regions, each of the unit regions corresponding to one of the light emitting units on the mother substrate, is provided. The cover plate further comprises a cutting line around each of the unit regions, a plurality unit of sealant regions between the cutting line and each of the unit regions, and a plurality unit of spacer disposing regions between the cutting line and each of the sealant regions. A glass frit is coated on the cover plate in the sealant regions and the spacer disposing regions. A curing process is performed to solidify the glass frit in the sealant regions to form a sealant and solidify the glass frit in the spacer disposing regions to form a spacer structure. The cover plate is disposed on the mother substrate, and a laser process is performed to the sealant so as to bond the cover plate and the mother substrate together, wherein the laser process is not performed to the spacer structure. A cutting process along the cutting line is performed, so as to form a plurality of light emitting devices.

In light of the foregoing, the glass frit is coated on the cover plate in the sealant regions and the spacer disposing regions so as to form the sealant and the spacer structure after the curing process. When bonding the cover plate and the mother substrate together, the laser process is only performed to the sealant but not performed to the spacer structure, and thus the spacer structure is not bonded with the mother substrate. Therefore, when performing the cutting process, the spacer structure may serve as a supporting structure to prevent the cutting process from damaging the sealant.

In order to make the aforementioned and other features and advantages of the present invention more comprehensible, several embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1A:
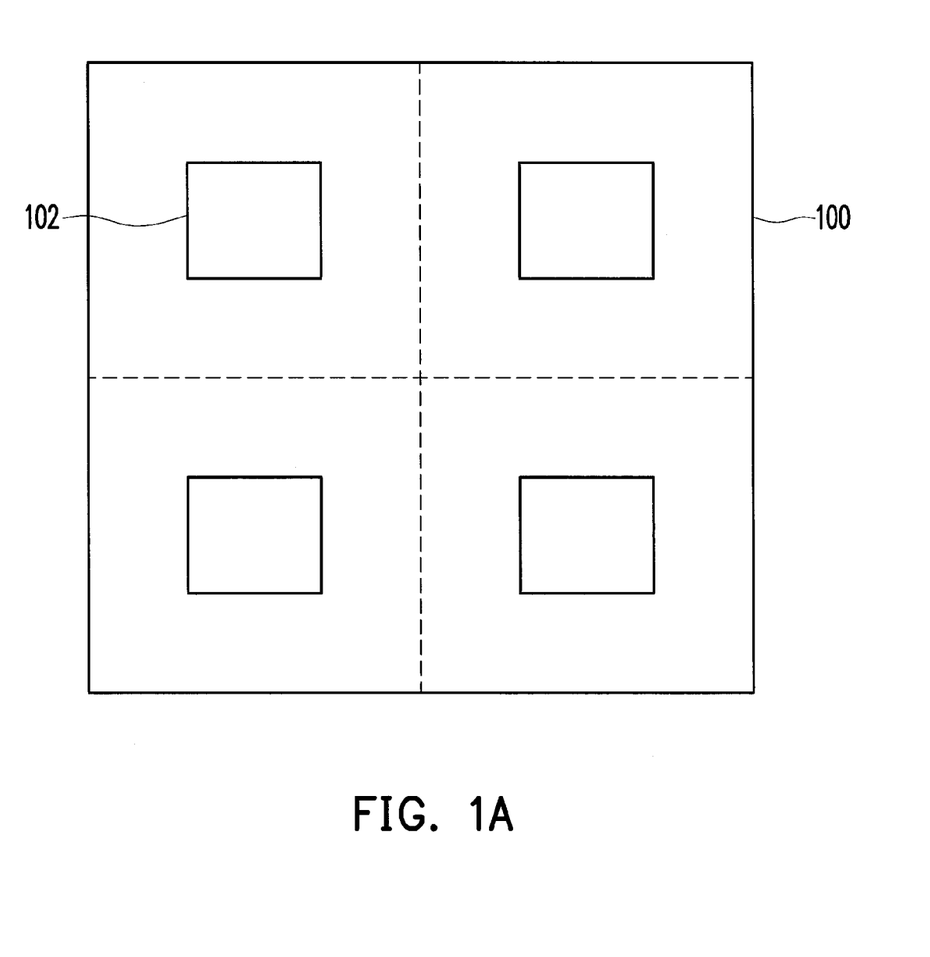
FIG. 1A to FIG. 1E are schematic diagrams showing a method of fabricating a light emitting devices according to an embodiment of the present invention.

FIG. 1A to FIG. 1E are schematic diagrams showing a method of fabricating a light emitting devices according to an embodiment of the present invention. Referring to FIG. 1A, a mother substrate 100 including plurality of light emitting units 102 is provided. The mother substrate 100 can be made of glass, quartz, an organic polymer, an opaque/reflective material (such as a conductive material, metal, wafer, ceramics, or any other appropriate material), or any other appropriate material. The light emitting units 102 are organic light emitting units, for example. Herein, each organic light emitting unit 102 comprises a cathode, an anode and an organic light emitting layer, which should not be construed as a limitation to the invention. According to another embodiment, the light emitting units 102 may be other type light emitting units. In addition, even though four light emitting units 102 on the mother substrate 100 are shown in the drawings for illustration, the present invention does not limit the number of the light emitting units 102 on the mother substrate 100. Generally, the number of the light emitting units 102 on the mother substrate 100 is related to the size of the mother substrate 100 and the size of the light emitting unit 102.

Figure 1B:
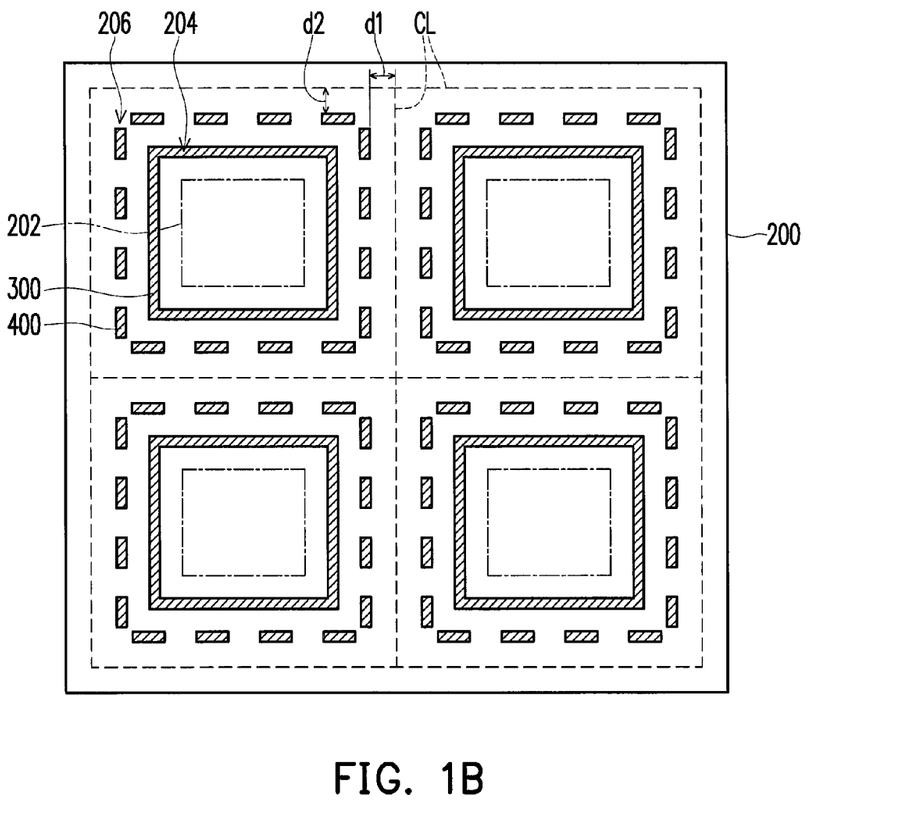

A liquid glass frit 300, 400 is coated on the cover plate 200 in the sealant regions 204 and the spacer disposing regions 206. The liquid glass frit 300, 400 is coated on the cover plate 200 in the sealant regions 204 and the spacer disposing regions 206 by a screen printing process, a dispenser process, a gravure printing process, an ink jet printing process, a relief printing process or an offset printing process. In the embodiment, because the distance d1/d2 between the cutting line CL and the spacer disposing region 206 is 0~100 μm, a smallest distance between the cutting line CL and the glass frit 400 coated in the spacer disposing region 206 is 0~100 μm. That is to say, the glass frit 400 coated in the spacer disposing regions 206 and the cutting line CL have a specific distance there between, or the glass frit 400 coated in the spacer disposing regions 206 is adjacent to the cutting line CL.

As shown in FIG. 1B, a cover plate 200 including a plurality of unit regions 202 is provided. The cover plate 200 can be made of glass, quartz, an organic polymer, an opaque/reflective material (such as a conductive material, metal, wafer, ceramics, or any other appropriate material), or any other appropriate material. Herein, both of the mother substrate 100 and the cover plate 200 are transparent, or one of the mother substrate 100 and the cover plate 200 is a transparent, while the other is non-transparent. Each of the unit regions 202 of the over plate 200 is corresponding to one of the light emitting units 102 on the mother substrate 100 (as shown in FIG. 1A). In addition, the cover plate 200 further comprises a cutting line CL around each of the unit regions 202, a plurality of sealant regions 204 between the cutting line CL and each of the unit regions 202, and a plurality of spacer disposing regions 206 between the cutting line CL and each of the sealant regions 204. For detail, the cover plate 200 has a plurality of sealant regions 204, and each of the sealant regions 204 correspondingly surrounds one of the unit regions 202. The cover plate 200 further has a plurality of spacer disposing regions 206, and each of the spacer disposing regions 206 correspondingly surrounds one of the sealant regions 204. According to the present embodiment, a distance d1 between the cutting line CL and the spacer disposing region 206 is 0~100 μm, and a distance d2 between the cutting line CL and the spacer disposing region 206 is 0~100 μm. The distance d1/d2 is the smallest distance between the cutting line CL and the spacer disposing region 206.

Next, a curing process is performed to solidify the liquid glass fit in the sealant regions 204 to form a sealant 300 and solidify the liquid glass fit in the spacer disposing regions 206 to form a spacer structure 400. According to the embodiment, the curing process comprises a heat baking process, so as to evaporate the solvent in the liquid glass frit to form the solid glass frit (the sealant 300 and the spacer structure 400). After the solvent in the liquid glass frit is evaporated so as to form the solid glass frit, the sealant 300 in the sealant regions 204 is bonded with the cover plate 200, and the spacer structure 400 in the spacer disposing regions 206 is also bonded with the cover plate 200.

Figure 1C:
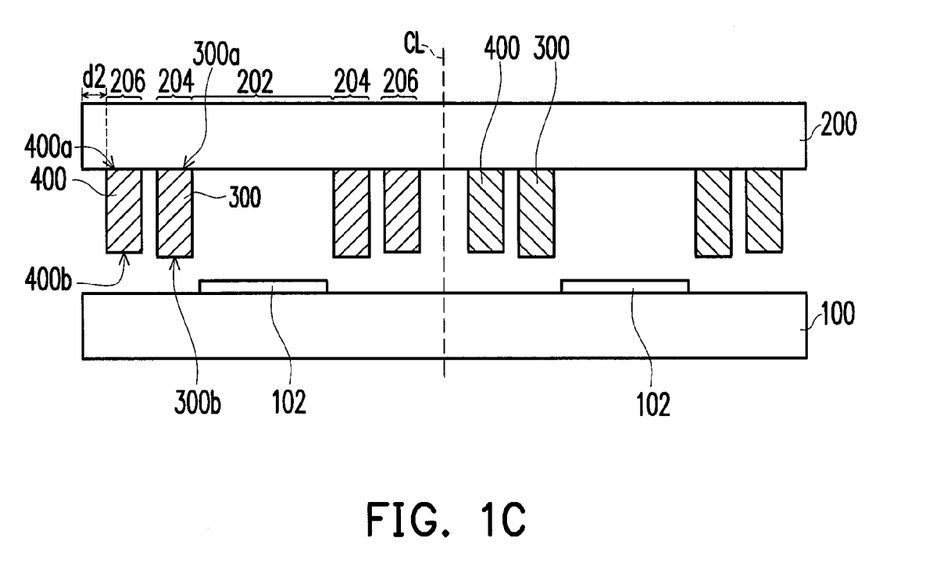

As shown in FIG. 1C, the cover plate 200 is disposed above the mother substrate 100. Since each of the unit regions 202 of the over plate 200 is corresponding to one of the light emitting units 102 on the mother substrate 100, each unit region 202 of the over plate 200 is aligned to one of the light emitting units 102 on the mother substrate 100 after disposing the cover plate 200 above the mother substrate 100. In addition, after the curing process, a surface 300a of the sealant 300 and a surface 400a of the spacer structure 400 are bonded or adhered to the cover plate 200, and therefore when disposing the cover plate 200 above the mother substrate 100, the sealant 300 and the spacer structure 400 are also overturned to the top of the mother substrate 300.

Figure 1D:
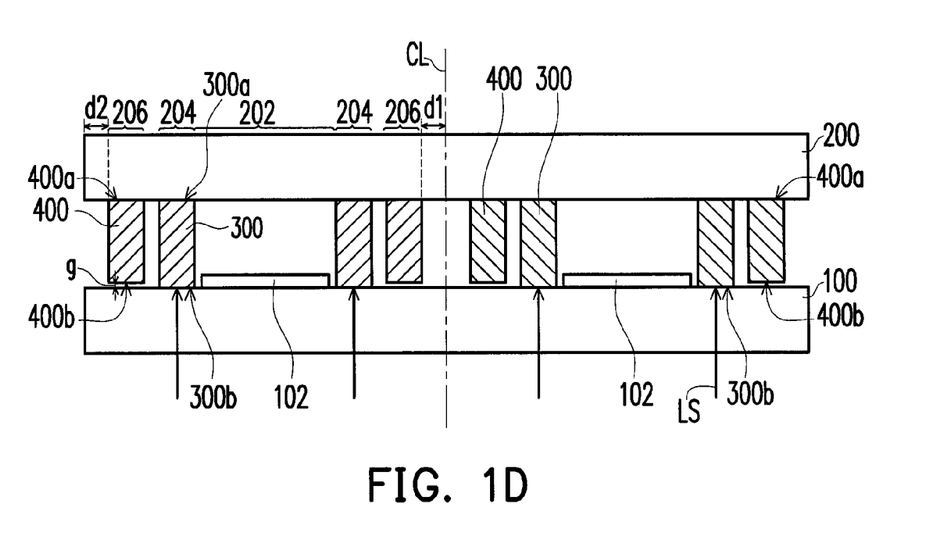

As shown in FIG. 1D, the cover plate 200 is moved to close the mother substrate 100 so as to make the surface 300a of the sealant 300 contacting with the mother substrate 100. Thereafter, a laser process LS is performed to the sealant 300 so as to bond the cover plate 200 and the mother substrate 100 together. In the embodiment, the laser process LS may partially melt the sealant 300 (glass frit). For detail, when the laser process LS is scanned on the surface 300b of the sealant 300, the surface 300b of the sealant 300 is partially melted, such that the surface 300b of the sealant 300 is adhered to the mother substrate 100. After the laser process LS is finished, the sealant 300 is solidified again when cooling to the room temperature, and therefore the sealant 300 is bonded with the mother substrate 100. In particular, the laser process LS is not performed to the spacer structure 400, and therefore the spacer structure 400 is not boned with the mother substrate 100.

After the above steps, a mother substrate structure of light emitting devices is formed, as shown in FIG. 1D, which comprises a mother substrate 100, a cover plate 200, a sealant 300 and a spacer structure 400. The mother substrate 100 includes a plurality of light emitting units 102 thereon. The cover plate 200 is disposed above the mother substrate 100 and comprises a plurality unit of regions 202, and each of the unit regions 202 is corresponding to one of the light emitting units 102 on the mother substrate 100. The cover plate 200 further comprises a cutting line CL around each of the unit regions 202, a plurality of sealant regions 204 between the cutting line CL and each of the unit regions 202, and a plurality of spacer disposing regions 206 between the cutting line CL and each of the sealant regions 204, wherein a distance d1/d2 (smallest distance) between the cutting line CL and each of the spacer disposing regions 206 is 0~100 μm. The sealant 300 is disposed in the sealant regions 204 so as to bond the mother substrate 100 and the cover plate 200 together. The spacer structure 400 is disposed in the spacer disposing regions 206 and surrounds each of the light emitting units 202, wherein a material of the spacer structure 400 and a material of the sealant 300 include a glass frit.

It s noted that, even though the surface 400b of the spacer structure 400 is not boned with the mother substrate 100, the surface 400b of the spacer structure 400 may contact the mother substrate 100 or not contact the mother substrate 100. If the surface 400b of the spacer structure 400 contacts the mother substrate 100, there is no gap between the surface 400b of the spacer structure 400 and the mother substrate 100. If the surface 400b of the spacer structure 400 does not contact the mother substrate 100, a gap g is existed between the surface 400b of the spacer structure 400 and the mother substrate 100. The gap g is smaller than 2 μm, preferably, the gap g is smaller than 0.5μm.

Moreover, the distance d1 between the spacer structure 400 and the cutting line CL is 0~100 μm, and the distance d2 between the spacer structure 400 and the cutting line CL of the cover plate 200 is also 0~100 μm.

Figure 1E:
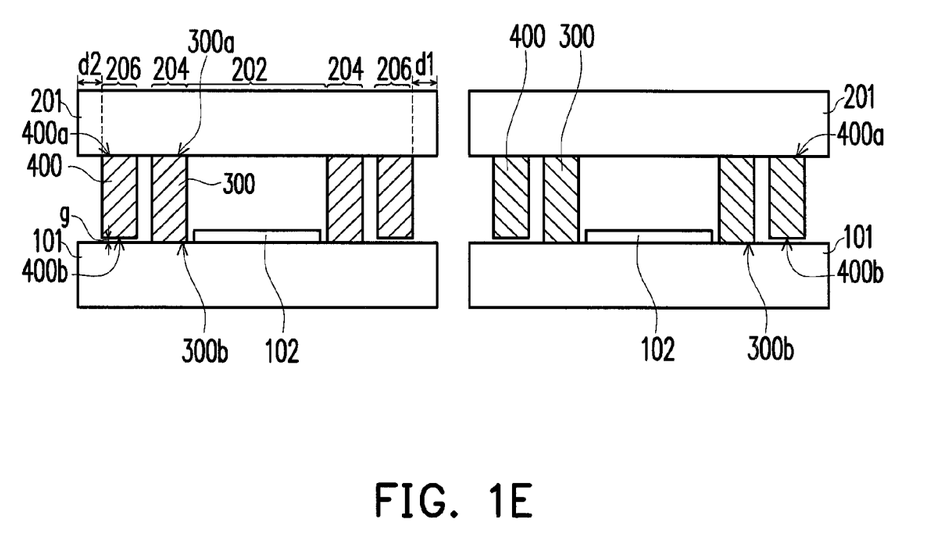

As shown in FIG. 1E, a cutting process along the cutting line CL is performed, so as to form a plurality of light emitting devices. Each of the light emitting devices comprises a substrate 101, a cover plate 201, a sealant 300 and a spacer structure 400. The substrate 101 comprises a light emitting unit 102 thereon. The cover plate 201 is disposed above the substrate 101 and comprises a unit region 202 corresponding to the light emitting unit 102 on the substrate 101. The cover plate 201 further comprises a cutting line CL around the unit region 202, a sealant region 204 between the cutting line CL and the unit region 202, and a spacer disposing region 206 between the cutting line CL and the sealant region 204, wherein a distance (smallest distance) d1, d2 between the cutting line CL and the spacer disposing region 206 is 0~100 μm. The sealant 300 is disposed in the sealant region 204 so as to bond the substrate 101 and the cover plate 201 together. The spacer structure 400 is disposed in the spacer disposing region 206 and surrounds the light emitting unit 102, wherein a material of the spacer structure 400 and a material of the sealant 300 include a glass frit.

It is noted that when performing the cutting process, the spacer structure 400 may serve as a supporting structure to enhance the supporting strength during the cutting process. Therefore, the spacer structure 400 may avoid a downward force of the cutting process damaging the sealant 300.

Figure 2:
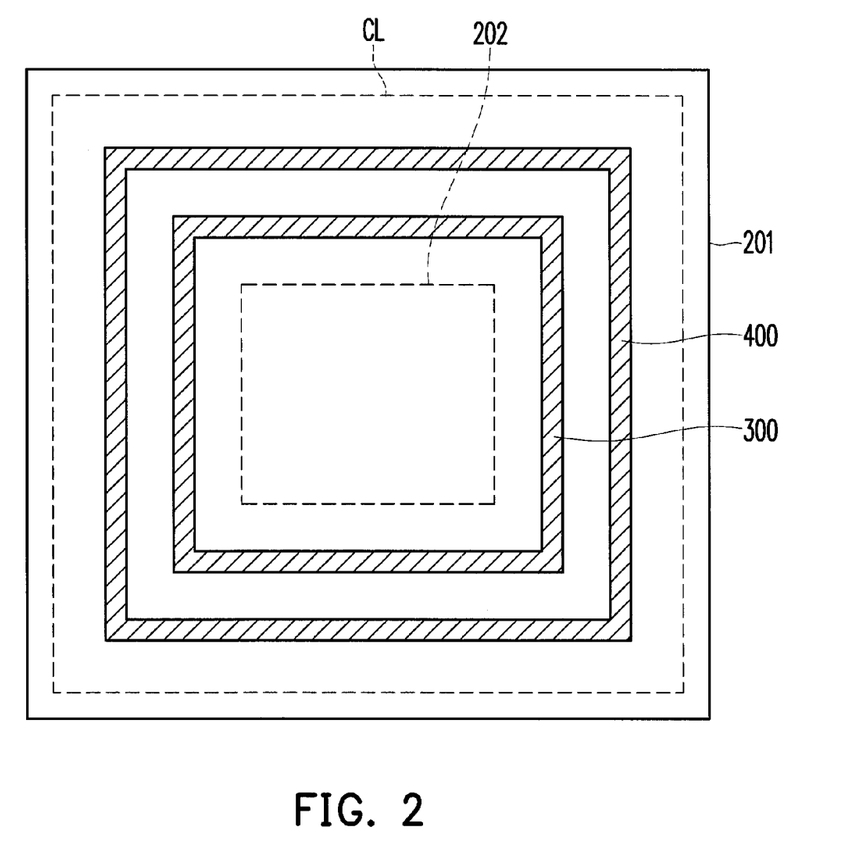
FIG. 2 and FIG. 3 are schematic diagrams showing the spacer structure surrounding the unit region according to embodiments of the present invention.
Figure 3:
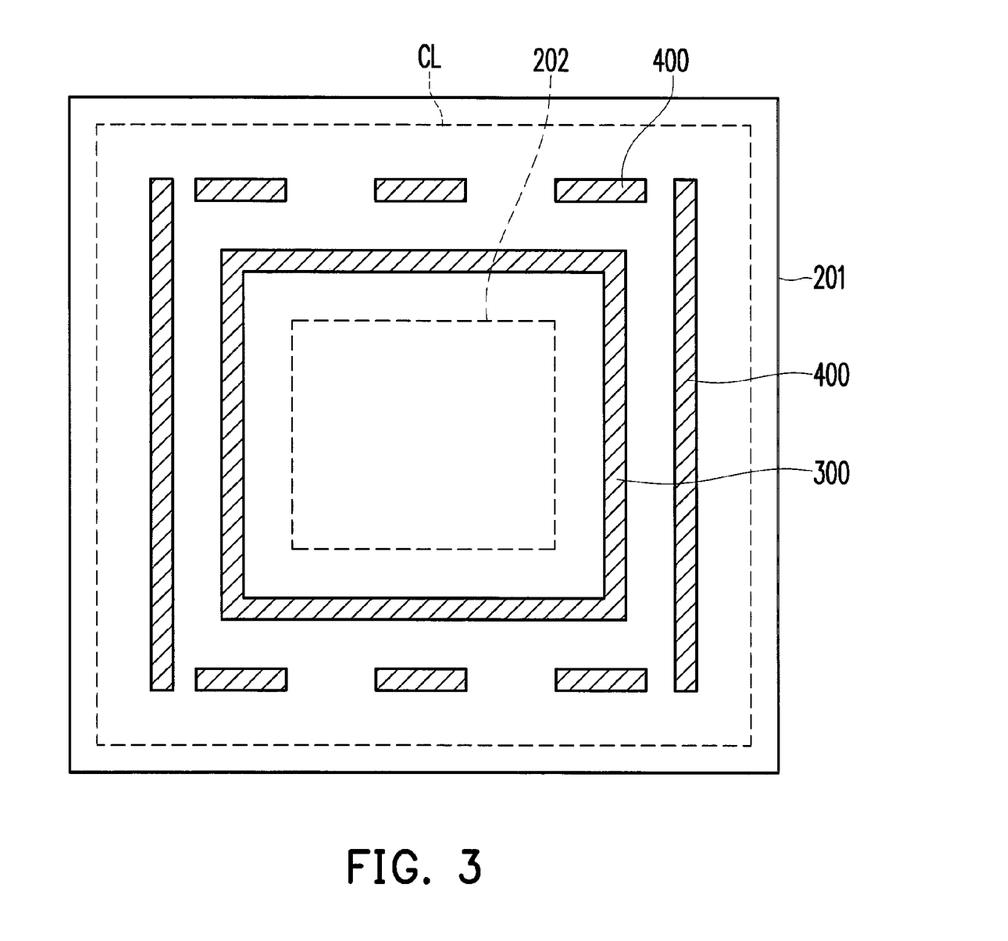

In the above embodiment, the spacer structure 400 around the sealant 300 is a plurality of block patterns for illustration, which should not be construed as a limitation to the invention. According to another embodiment, the spacer structure 400 around the sealant 300 may also be a continuous ring pattern, as shown in FIG. 2, or a combination of different shape patterns, as shown in FIG. 3.

In light of the foregoing, in the embodiment, the glass frit is coated on the cover plate in the sealant regions and the spacer disposing regions, so as to form the sealant and the spacer structure after the curing process. When bonding the cover plate and the mother substrate together, the laser process is only performed to the sealant but not performed to the spacer structure, and thus the spacer structure is not bonded with the mother substrate. Therefore, when performing the cutting process, the spacer structure may serve as a supporting structure to prevent the cutting process from damaging the sealant.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A mother substrate structure of light emitting devices, comprising:
   a mother substrate including a plurality of light emitting units thereon;
   a cover plate, disposed above the mother substrate and comprising a plurality of unit regions, each of the unit regions corresponding to one of the light emitting units on the mother substrate, wherein the cover plate further comprises a cutting line around each of the unit regions, a plurality of sealant regions between the cutting line and each of the unit regions, and a plurality of spacer disposing regions between the cutting line and each of the sealant region, wherein a distance between the cutting line and each of the spacer disposing regions is 0~100 μm;
   a sealant, disposed in the sealant regions so as to bond the mother substrate and the cover plate together; and
   a spacer structure, disposed in the spacer disposing regions and surrounds each of the light emitting units, wherein a material of the spacer structure and a material of the sealant include a glass frit, and there is an air gap between the substrate and an entirety of a bottom surface of the spacer structure, wherein the air gap between the spacer structure and the mother substrate is smaller than 2μm.

2. The mother substrate structure as claimed in claim 1, wherein the sealant is bonded with the mother substrate, and the sealant is also bonded with the cover plate.

3. The mother substrate structure as claimed in claim 1, wherein the spacer structure is bonded with the cover plate, and the spacer structure is not bonded with the mother substrate.

4. The mother substrate structure as claimed in claim 1, wherein the air gap between the spacer structure and the mother substrate is smaller than 0.5 μm.

5. The mother substrate structure as claimed in claim 1, wherein the spacer structure is a continuous ring pattern, a plurality of block patterns or a combination thereof.

6. A light emitting device, comprising:
   a substrate comprising a light emitting unit thereon;
   a cover plate, disposed above the substrate and comprising a unit region corresponding to the light emitting unit on the substrate, wherein the cover plate further comprises a cutting line around the unit region, a sealant region between the cutting line and the unit region, and a spacer disposing region between the cutting line and the sealant region, wherein a distance between the cutting line and the spacer disposing region is 0~100 μm;
   a sealant, disposed in the sealant region so as to bond the substrate and the cover plate together; and
   a spacer structure, disposed in the spacer disposing region and surrounds the light emitting unit, wherein a material of the spacer structure and a material of the sealant include a glass frit, and there is an air gap between the substrate and an entirety of a bottom surface of the spacer structure.

7. The light emitting device as claimed in claim 6, wherein the sealant is bonded with the substrate, and the sealant is also bonded with the cover plate.

8. The light emitting device as claimed in claim 6, wherein the spacer structure is bonded with the cover plate, and the spacer structure is not bonded with the substrate.

9. The light emitting device as claimed in claim 8, wherein the air gap between the spacer structure and the substrate is smaller than 2 μm.

10. The light emitting device as claimed in claim 9, wherein the air gap between the spacer structure and the substrate is smaller than 0.5 μm.

11. The light emitting device as claimed in claim 6, wherein the spacer structure is a continuous ring pattern, a plurality of block patterns or a combination thereof.

* * * * *